(12) United States Patent
Chou et al.

(10) Patent No.: US 11,752,638 B2
(45) Date of Patent: *Sep. 12, 2023

(54) SUBSTRATE HANDLING DEVICE AND PROCESSING CHAMBER

(71) Applicant: TAIWAN SEMICONDUCTOR MANUFACTURING COMPANY, LTD., Hsinchu (TW)

(72) Inventors: You-Hua Chou, Hsinchu (TW); Kuo-Sheng Chuang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/835,921

(22) Filed: Jun. 8, 2022

(65) Prior Publication Data

US 2022/0331976 A1 Oct. 20, 2022

Related U.S. Application Data

(60) Continuation of application No. 16/533,948, filed on Aug. 7, 2019, now Pat. No. 11,376,744, which is a division of application No. 15/601,079, filed on May 22, 2017, now Pat. No. 10,399,231.

(51) Int. Cl.
| | |
|---|---|
| *B25J 11/00* | (2006.01) |
| *H01L 21/687* | (2006.01) |
| *H01L 21/677* | (2006.01) |
| *B25J 15/00* | (2006.01) |

(52) U.S. Cl.
CPC ....... *B25J 11/0095* (2013.01); *B25J 15/0014* (2013.01); *H01L 21/67766* (2013.01); *H01L 21/6875* (2013.01); *H01L 21/68707* (2013.01); *H01L 21/68742* (2013.01); *H01L 21/68757* (2013.01)

(58) Field of Classification Search
CPC .............. B25J 11/0095; B25J 15/0014
See application file for complete search history.

(56) References Cited

U.S. PATENT DOCUMENTS

| | | |
|---|---|---|
| 7,654,596 B2 | 2/2010 | Mantz |
| 7,661,921 B2 | 2/2010 | Kim |
| 7,748,760 B2 | 7/2010 | Kushida |
| 8,764,085 B2 | 7/2014 | Urabe |

(Continued)

*Primary Examiner* — Stephen A Vu
(74) *Attorney, Agent, or Firm* — Hauptman Ham, LLP

(57) ABSTRACT

A substrate handling device includes a substrate reception area defined by an edge. The substrate reception area includes a planar surface, wherein the edge extends upward from the planar surface. The substrate reception area further includes a plurality of contact structures extending upwards from the planar surface, wherein a first contact structure of the plurality of contact structures directly contacts a side surface of the edge, a second contact structure of the plurality of contact structures separated from the edge, a shape of the first contact structure is different from a shape of the second contact structure. The substrate reception area and the planar surface include a first material. Each contact structure of the plurality of contact structures includes a second material different from the first material, and the second material has a hardness aligned to a hardness of a substrate material.

20 Claims, 5 Drawing Sheets

(56) References Cited

U.S. PATENT DOCUMENTS

| | | |
|---|---|---|
| 8,770,640 B2 | 7/2014 | Kimura |
| 8,864,202 B1 | 10/2014 | Schrameyer |
| 9,425,076 B2 | 8/2016 | Agarwal |
| 10,399,231 B2 * | 9/2019 | Chou .................. B25J 15/0014 |
| 2002/0041102 A1 | 4/2002 | Krauskopf |
| 2002/0071756 A1 | 6/2002 | Gonzalez |
| 2006/0113806 A1 | 6/2006 | Tsuji |
| 2007/0128008 A1 | 6/2007 | Morikawa |
| 2008/0105201 A1 | 5/2008 | Ronan et al. |
| 2011/0241367 A1 | 10/2011 | Hosek |
| 2012/0049555 A1 | 3/2012 | Fujii |
| 2012/0315113 A1 | 12/2012 | Hiroki |
| 2013/0076055 A1 | 3/2013 | Hino |
| 2013/0341946 A1 | 12/2013 | Yamanaka |
| 2014/0210224 A1 | 7/2014 | Hashimoto |
| 2016/0005638 A1 | 1/2016 | Agarwal et al. |

\* cited by examiner

400

```
┌─────────────────────────────────────────────┐
│  Determine a hardness of a substrate material.  │── 410
└─────────────────────────────────────────────┘
                      ▼
┌─────────────────────────────────────────────┐
│  Match a hardness of a substrate contact material │── 420
│  to the hardness of the substrate material.       │
└─────────────────────────────────────────────┘
                      ▼
┌─────────────────────────────────────────────┐
│  Add the substrate contact material to a substrate │── 430
│  handling device.                                  │
└─────────────────────────────────────────────┘
                      ▼
┌─────────────────────────────────────────────┐
│  Select the substrate handling device from a      │── 440
│  plurality of substrate handling devices.         │
└─────────────────────────────────────────────┘
                      ▼
┌─────────────────────────────────────────────┐
│  Modify a surface of the substrate contact material│
│  to increase a coefficient of static friction of the│── 450
│  surface of the substrate contact material.       │
└─────────────────────────────────────────────┘
                      ▼
┌─────────────────────────────────────────────┐
│  Control a position of the substrate using the    │── 460
│  substrate handling device.                       │
└─────────────────────────────────────────────┘
```

Fig. 4

SUBSTRATE HANDLING DEVICE AND PROCESSING CHAMBER

PRIORITY CLAIM

The present application is a continuation of U.S. application Ser. No. 16/533,948, filed Aug. 7, 2019, which is a divisional of U.S. application Ser. No. 15/601,079, filed May 22, 2017, now U.S. Pat. No. 10,399,231, issued Sep. 3, 2019, which are incorporated herein by reference in their entireties.

BACKGROUND

In integrated circuit (IC) manufacturing, individual IC elements are formed and tested using various pieces of manufacturing equipment to perform multiple operations. Substrates on which the ICs are built are moved between and within the various pieces of equipment while being protected from impurities that could compromise circuit function. Such movement often includes handling substrates with devices that contact the substrates at multiple locations.

Manufacturing of IC substrates increasingly includes backside operations in which various materials are used to form bottom layers. These bottom layers often come into contact with substrate handling devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flowchart of a method of aligning a substrate contact material to a substrate material, in accordance with some embodiments.

DETAILED DESCRIPTION

Figure 1A:
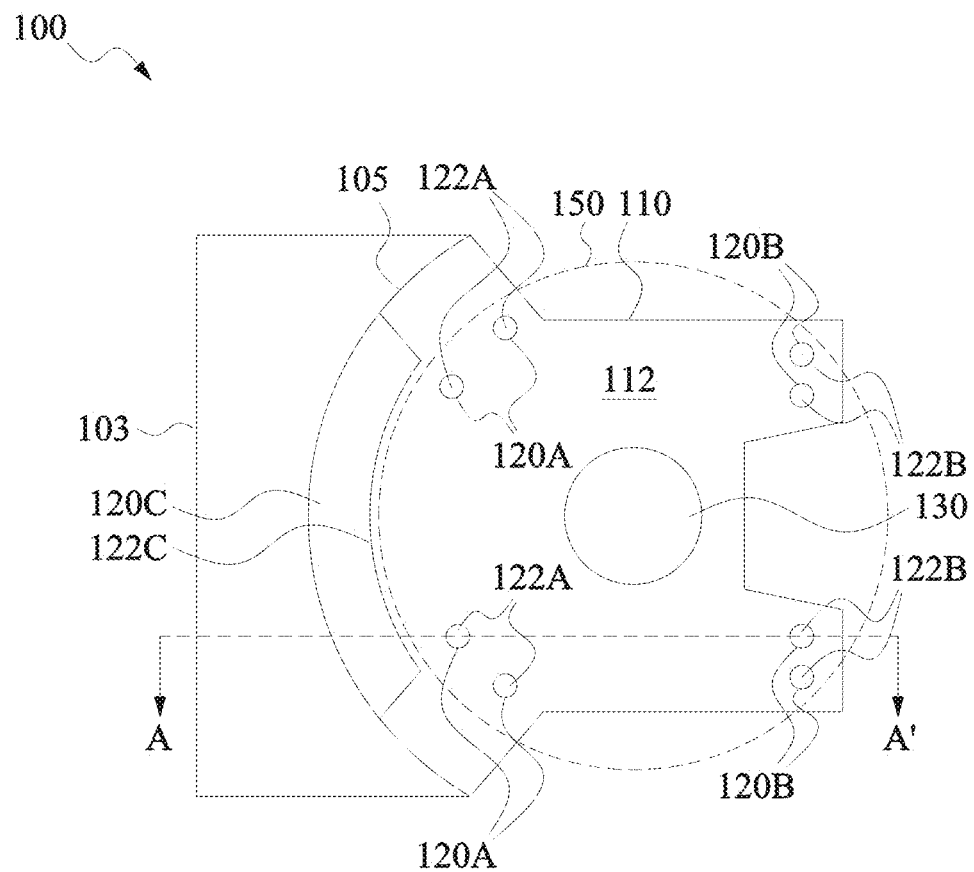
FIGS. 1A-1D are diagrams of a substrate handling device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a substrate handling device includes a plurality of contact structures. Each contact structure of the plurality of contact structures includes a material having a hardness aligned to a hardness of a substrate material. Because of this hardness alignment, scratching or other damage to either the substrate or the substrate handling device is reduced compared to approaches in which the hardness is not aligned with the hardness of the substrate material being contacted.

Figure 1B:
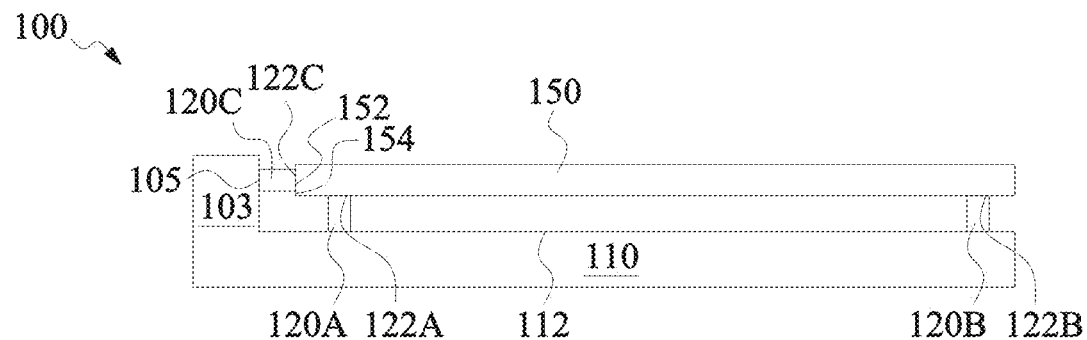
Figure 1C:
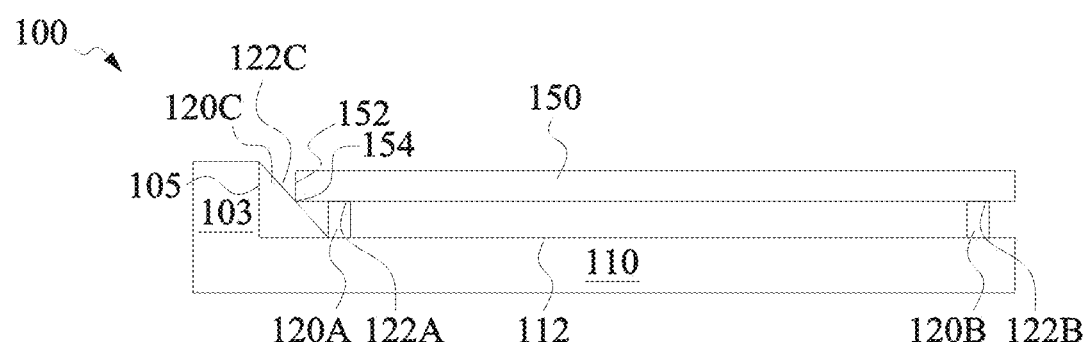
Figure 1D:
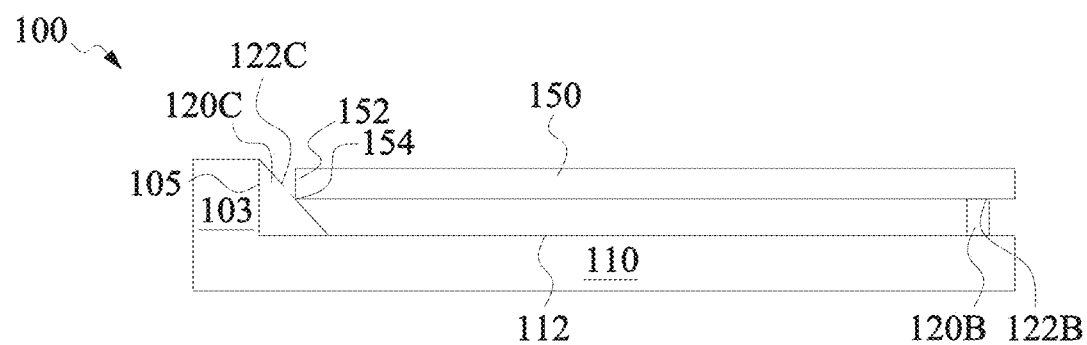

FIGS. 1A-1D are diagrams of a substrate handling device 100, in accordance with some embodiments. FIG. 1A depicts a top view of substrate handling device 100, and FIGS. 1B-1D depict cross-sectional views of substrate handling device 100 along line A-A', in accordance with some embodiments. In addition to substrate handling device 100, FIGS. 1A-1D depict a substrate 150.

Substrate handling device 100 includes an edge 105, a substrate reception area 110 defined by edge 105, a plurality of contact structures 120A, 120B, and 120C (collectively 120), and an aperture 130. In the embodiment depicted in FIG. 1A, substrate handling device 100 includes four contact structures 120A, four contact structures 120B, and a single contact structure 120C. In various embodiments, substrate handling device 100 includes greater or fewer than four contact structures 120A. In various embodiments, substrate handling device 100 includes greater or fewer than four contact structures 120B. In various embodiments, substrate handling device 100 includes greater than a single contact structure 120C.

Substrate handling device 100 is a rigid structure configured to control a position of a substrate by supporting a weight of the substrate. In some embodiments, substrate handling device 100 is configured to control multiple positions of the substrate by supporting lateral movement of the substrate while transporting the substrate from a first position to a second position.

In some embodiments, substrate handling device 100 is a robot blade of a robot arm. In some embodiments, substrate handling device 100 is a component of a processing chamber in an IC manufacturing environment. In some embodiments, substrate handling device 100 is a component of a test station. In some embodiments, substrate handling device 100 is one substrate handling device 100 of a plurality of substrate handling devices 100 of a substrate carrier.

Substrate handling device 100 includes one or more metals or other materials having rigidity and strength sufficient to support, and, in some embodiments, to transport, a substrate.

Edge 105 includes a substantially vertical portion of substrate handling device 100 that separates substrate reception area 110 from a relatively thicker portion 103 of substrate handling device 100, thereby defining substrate reception area 110 within substrate handling device 100. In some embodiments, edge 105 has a profile that includes portions in addition to the substantially vertical portion.

In the embodiment depicted in FIG. 1A, edge 105 has an arc contour in plan view. In some embodiments, edge 105 has a straight-line contour. In some embodiments, edge 105 has a contour that includes multiple segments, and each segment has an arc or straight-line shape as depicted in a top view. In some embodiments, edge 105 includes multiple, non-continuous segments, and each segment has an arc or straight-line contour.

Substrate reception area 110 is a relatively thinner portion of substrate handling device 100 defined by edge 105 in comparison with the thicker portion forming the edge. Substrate reception area 110 has a substantially planar upper surface 112. In some embodiments, upper surface 112 is perpendicular to edge 105.

Plurality of contact structures 120 includes contact structures 120A positioned in substrate reception area 110 near edge 105, contact structures 120B positioned in substrate reception area 110 distal from edge 105, and contact structure 120C at the substantially vertical portion of edge 105.

Each contact structure 120A includes a top surface 122A, each contact structure 120B includes a top surface 122B, and contact structure 120C includes a side surface 122C. In some embodiments, plurality of contact structures 120 includes more than one contact structure 120C, and each contact structure 120C includes a side surface 122C.

Each contact structure 120A extends above upper surface 112, and is thereby configured so that, in operation, top surface 122A contacts a substrate, e.g. substrate 150, being supported in substrate reception area 110, at a position near edge 105. Each contact structure 120B extends above upper surface 112, and is thereby configured so that, in operation, top surface 122B contacts a substrate, e.g. substrate 150, being supported in substrate reception area 110, at a position distal from edge 105.

Contact structure 120C extends laterally from edge 105, and is thereby configured so that, in operation, side surface 122C is capable of contacting a substrate, e.g. substrate 150, being supported, and in some embodiments transported, in substrate reception area 110, at a position along edge 105. In the embodiment depicted in FIG. 1B, side surface 122C is substantially vertical, thereby being configured so that, in operation, side surface 122C contacts a sidewall 152 of substrate 150.

In the embodiment depicted in FIG. 1B, contact structure 120C is attached to edge 105 so as to be located at and extend laterally from edge 105. In some embodiments, contact structure 120C is attached to upper surface 112 so as to be located at and extend laterally from edge 105.

In the embodiment depicted in FIG. 1C, side surface 122C includes a horizontal component, thereby being configured so that, in operation, side surface 122C contacts a corner 154 of substrate 150.

In the embodiment depicted in FIG. 1D, side surface 122C includes a horizontal component, plurality of contact structures 120 does not include contact structures 120A, and is thereby configured so that, in operation, a substrate, e.g. substrate 150, is supported by contact structure 120C along edge 105 and by contact structures 120B distal to edge 105.

In some embodiment depicted in FIGS. 1C and 1D, contact structure 120C is attached to edge 105 so as to be located at and extend laterally from edge 105. In some embodiments depicted in FIGS. 1C and 1D, contact structure 120C is attached to upper surface 112 so as to be located at and extend laterally from edge 105.

Each of top surfaces 122A and 122B and side surface 122C is a surface of a contact material having a hardness aligned to a hardness of a material of a substrate, e.g. substrate 150. In some embodiments, the contact material has a hardness aligned to the hardness of a substrate material. In some embodiments, one or more of contact structures 120A, 120B, or 120C includes only the contact material. In some embodiments, one or more of contact structures 120A, 120B, or 120C includes one or more materials in addition to the contact material.

In some embodiments, one or both of the contact or substrate material includes silicon, silicon dioxide, silicon nitride, silicon carbide, a metal, a metal alloy, a metal oxide, or a polymer.

In some embodiments, material hardness is determined based on the Mohs scale of mineral hardness. In some embodiments, the contact material having the hardness aligned to the hardness of the substrate material is based on a range of values determined by a Mohs hardness scale value of the substrate material. In some embodiments, the contact material having the hardness aligned to the hardness of the substrate material is based on the contact material having a Mohs hardness scale value within two of a Mohs hardness scale value of the substrate material. In some embodiments, the contact material having the hardness aligned to the hardness of the substrate material is based on the contact material having a Mohs hardness scale value within one of a Mohs hardness scale value of the substrate material.

In a first non-limiting example, the substrate material is silicon nitride, having a Mohs hardness scale value of 9.5. In this case, a range for the contact material corresponding to having a Mohs hardness scale value within one of the Mohs hardness scale value of the substrate value would be from 8.5 through 10.5. A contact material of aluminum oxide, having a Mohs hardness scale value of 9.0, within the range of 8.5 through 10.5, would have a hardness aligned with the hardness of silicon nitride, in this example.

In a second non-limiting example, the substrate material is silicon dioxide, having a Mohs hardness scale value of 7.0. In this case, a range for the contact material corresponding to having a Mohs hardness scale value within two of the Mohs hardness scale value of the substrate value would be from 5.0 through 9.0. A contact material of aluminum oxide, having a Mohs hardness scale value of 9.0, within the range of 5.0 through 9.0, would have a hardness aligned with the hardness of silicon dioxide, in this example. A contact material of quartz, having a Mohs hardness scale value of 7.0, within the range of 5.0 through 9.0, would also have a hardness aligned with the hardness of silicon dioxide, in this example.

In some embodiments, one or more of top surface 122A, top surface 122B, or side surface 122C includes a pattern, e.g. one or more of contact material surface patterns 300A, 300B, or 300C, discussed below with respect to FIG. 3, that increases a coefficient of static friction of the one or more of top surface 122A, top surface 122B, or side surface 122C. In some embodiments, compared to a planar surface, the pattern increases the coefficient of static friction by a factor of from 2 to 10.

Aperture 130 is an opening in substrate handling device 100 configured to enable substrate handling device 100 to be mechanically coupled with a robot arm or other controlling apparatus. In the embodiment depicted in FIG. 1A, aperture 130 is located in substrate reception area 110. In some embodiments, aperture 130 is located at a position on substrate handling device 100 outside of substrate reception area 110. In some embodiments, substrate handling device 100 does not include aperture 130, and substrate handling device 100 is otherwise configured to be mechanically coupled with a robot arm or other controlling apparatus.

In the embodiment depicted in FIGS. 1A-1D, substrate reception area 110 is bifurcated, and contact structures 120B are separated by a gap and aligned in a substantially straight line. In some embodiments, substrate reception area 110 has a Y-shape, and contact structures 120B are separated by a gap and aligned along an arc corresponding to a perimeter of a substrate, e.g. substrate 150. In some embodiments, substrate reception area 110 is single-ended, and contact structures 120B are arranged in a straight line or an arc without a gap.

In some embodiments, plurality of contact structures 120 includes contact structures in addition to contact structures 120A, 120B, and 120C. In some embodiments, plurality of contact structures 120 includes one or more contact structures (not shown) positioned at or near a center of substrate reception area 110 and configured to contact a backside of a substrate, e.g. substrate 150, at or near a center of the substrate.

By including the features described above, substrate handling device 100 is configured to contact a substrate using a contact material having a hardness aligned with the hardness of the substrate material being contacted. Because of this hardness alignment, scratching or other damage to either the substrate or the substrate handling device is reduced compared to approaches in which the hardness is not aligned with the hardness of the substrate material being contacted.

Reducing substrate damage reduces the risk of damaging a circuit or structure on the substrate. Reducing substrate handling device damage can increase the useful lifetime of the substrate handling device. Reducing substrate and substrate handling device damage also reduces the risk of releasing particles from substrate and substrate handling device surfaces that could introduce impurities capable of compromising circuit function.

In some embodiments, by including one or more of top surface 122A, top surface 122B, or side surface 122C, substrate handling device 100 is also capable of contacting a substrate using a surface with a higher coefficient of friction than that of a surface that does not include a pattern that increases the coefficient of static friction. The increased coefficient of static friction reduces the likelihood of slippage while supporting, and in some embodiments transporting, substrates, thereby reducing the likelihood of scratching or other damage from abrasion between a substrate and substrate handling device 100.

Figure 2A:
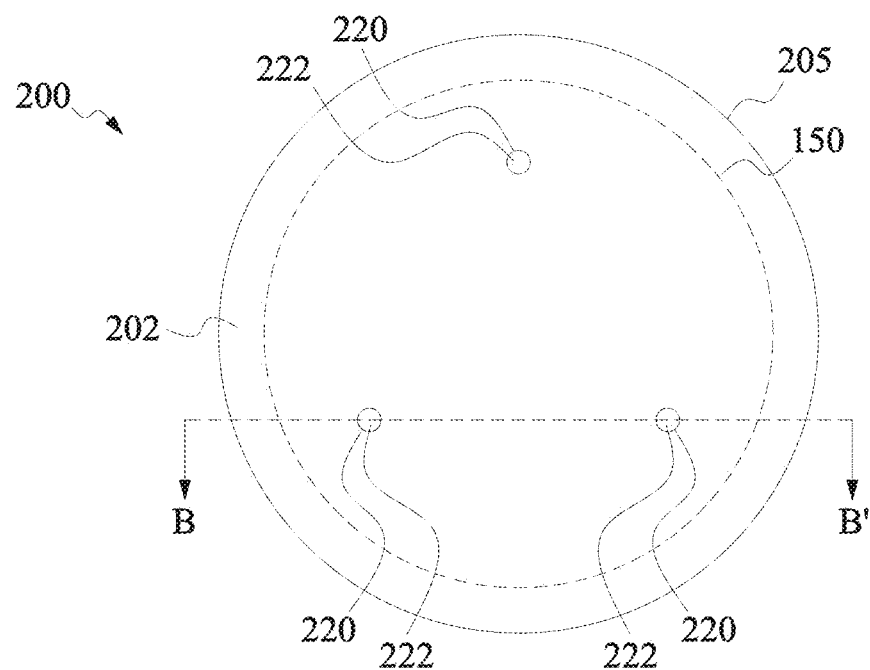
FIGS. 2A-2B are diagrams of a substrate handling device, in accordance with some embodiments.
Figure 2B:
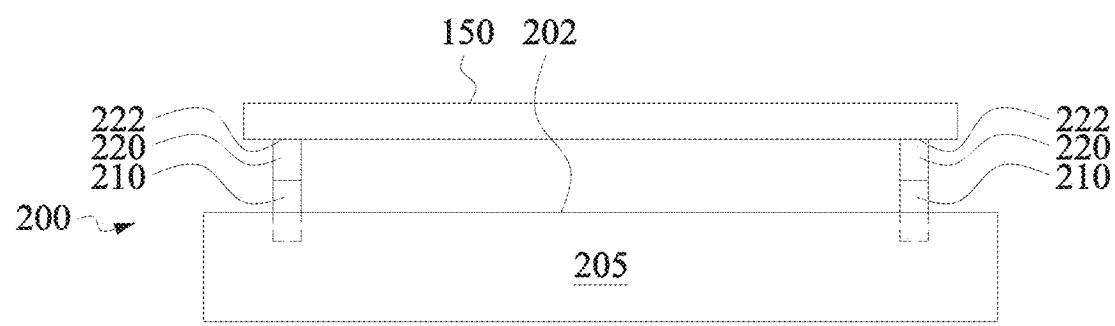

FIGS. 2A-2C are diagrams of a substrate handling device 200, in accordance with some embodiments. FIG. 2A depicts a top view of substrate handling device 200, and FIG. 2B depicts a cross-sectional view of substrate handling device 200 along line B-B'. In addition to substrate handling device 200, FIGS. 2A-2B depict substrate 150, discussed above with respect to FIGS. 1A-1D.

Substrate handling device 200 includes a body 205, a plurality of lift pins 210 retractable within body 205, and a plurality of contact structures 220 corresponding to plurality of lift pins 210. In some embodiments, substrate handling device 200 is a component of a processing chamber in an IC manufacturing environment. In some embodiments, substrate handling device 200 is a component of a test station.

Body 205 is a disk having a substantially planar upper surface or upper surface portion 202. Body 205 includes one or more metals or other materials having rigidity and strength sufficient to support a substrate during one or more IC processing operations. In some embodiments, body 205 is a platen. In some embodiments, body 205 is configured to rotate. In some embodiments, body 205 is configured to increase and/or decrease a temperature of body 205.

Plurality of lift pins 210 is configured to support a substrate during loading and unloading of the substrate from body 205 by raising and lowering the substrate relative to upper surface or upper surface portion 202. In some embodiments, plurality of lift pins 210 includes three lift pins 210. In some embodiments, plurality of lift pins 210 includes more than three lift pins 210.

Each contact structure 220 of plurality of contact structures 220 is positioned atop a corresponding lift pin 210 of plurality of lift pins 210, and includes a top surface 222.

Plurality of contact structures 220 is similar to contact structures 120A and 120B of plurality of contact structures 120, and top surfaces 222 are similar to top surfaces 122A and 122B, discussed above with respect to substrate handling device 100 and FIGS. 1A-1D.

By including the features of plurality of contact structures 220, substrate handling device 200 is configured to contact a substrate using a contact material having a hardness aligned with the hardness of the substrate material being contacted. Substrate handling device 200 is thereby capable of providing the advantages discussed above with respect to substrate handling device 100.

In some embodiments, by including top surfaces 222 patterned to have increased coefficients of static friction, substrate handling device 200 is configured to provide the additional advantages discussed above with respect to substrate handling device 100.

Figure 3:
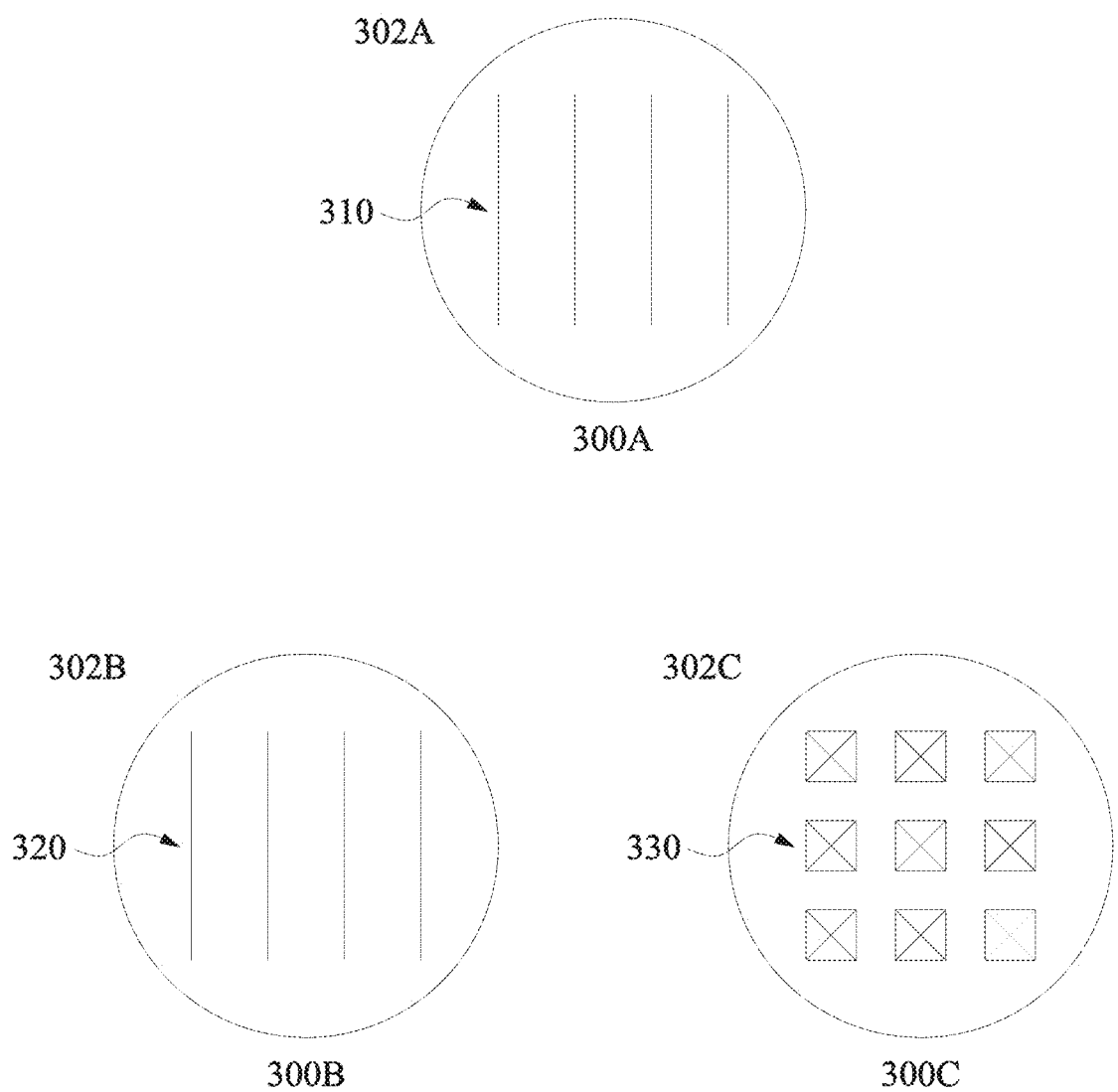
FIG. 3 is a diagram of contact material surface patterns, in accordance with some embodiments.

FIG. 3 is a diagram of contact material surface patterns 300A, 300B, and 300C, in accordance with some embodiments. FIG. 3 depicts a top view of each of contact material surface patterns 300A, 300B, and 300C. Each of contact material surface patterns 300A, 300B, and 300C is usable as a contact material surface pattern of one or more of top surfaces 122A, top surfaces 122B, or side surface 122C, discussed above with respect to substrate handling device 100 and FIGS. 1A-1D.

Contact material surface pattern 300A is a ridge pattern including a plurality of ridges 310 extending upwardly from a planar surface 302A. In some embodiments, individual ridges of plurality of ridges 310 extend parallel to each other.

Each ridge of plurality of ridges 310 extends equidistantly above planar surface 302A. In some embodiments, plurality of ridges 310 extends above planar surface 302A by a distance of 2 micrometers (μm) to 10 μm. In some embodiments, individual ridges of plurality of ridges 310 are separated by a distance of 5 μm to 100 μm.

Contact material surface pattern 300B is a groove pattern including a plurality of grooves 320 extending downwardly from a planar surface 302B. In some embodiments, individual grooves of plurality of grooves 320 extend parallel to each other.

Each groove of plurality of grooves 320 extends equidistantly below planar surface 302B. In some embodiments, plurality of grooves 320 extends below planar surface 302B by a distance of 2 μm to 10 μm. In some embodiments, individual grooves of plurality of grooves 320 are separated by a distance of 5 μm to 100 μm.

Contact material surface pattern 300C is a pyramid pattern including a plurality of pyramids 330 extending upwardly from a planar surface 302C. In some embodiments, individual pyramids of plurality of pyramids 330 have a rectangular base. In some embodiments, individual pyramids of plurality of pyramids 330 have a circular base.

In some embodiments, plurality of pyramids 330 is arranged in an array of rows and columns. In some embodiments, plurality of pyramids 330 is arranged in a series of parallel lines. In some embodiments, plurality of pyramids 330 is arranged in a series of intersecting lines.

Each pyramid of plurality of pyramids 330 extends equidistantly above planar surface 302C. In some embodiments, plurality of pyramids 330 extends above planar surface 302C by a distance of 2 µm to 10 µm. In some embodiments, individual pyramids of plurality of pyramids 330 are separated by a distance of 5 µm to 100 µm.

By including plurality of ridges 310, plurality of grooves 320, and plurality of pyramids 330, each of contact material surface patterns 300A, 300B, and 300C, respectively, provide a high coefficient of static friction compared to substantially planar contact material surface patterns.

By providing a relatively high coefficient of static friction, each of contact material surface patterns 300A, 300B, and 300C is usable to provide the advantages discussed above with respect to top surfaces 122A, 122B, and 222, and side surface 122C.

FIG. 4 is a flowchart of a method 400 of aligning a substrate contact material to a substrate material, in accordance with one or more embodiments. Method 400 is implemented using a substrate handling device such as substrate handling devices 100 or 200, discussed above with respect to FIGS. 1A-1D and 2A-2B, respectively.

The sequence in which the operations of method 400 are depicted in FIG. 4 is for illustration only; the operations of method 400 are capable of being executed in sequences that differ from that depicted in FIG. 4. In some embodiments, operations in addition to those depicted in FIG. 4 are performed before, between and/or after the operations depicted in FIG. 4.

At operation 410, a hardness of a substrate material is determined. In some embodiments, determining the hardness of the substrate material includes determining a Mohs hardness scale value of the substrate material. In some embodiments, determining the hardness of the substrate material includes looking up a hardness value in a table, a database, or other suitable reference. In some embodiments, determining the hardness of the substrate material includes performing a test on the substrate material.

In some embodiments, determining the hardness of the substrate material includes determining the hardness of a material from which the substrate is formed. In some embodiments, determining the hardness of the substrate material includes determining the hardness of a material different from the material from which the substrate is formed. In some embodiments, determining the hardness of the substrate material includes determining the hardness of a material layer deposited on a backside of the substrate.

At operation 420, a hardness of a substrate contact material is matched to the hardness of the substrate material. In some embodiments, matching the hardness of the substrate contact material to the hardness of the substrate material includes matching hardness based on the Mohs scale of mineral hardness. In some embodiments, matching the hardness of the substrate contact material to the hardness of the substrate material is based on a range of values determined by a Mohs hardness scale value of the substrate material.

In some embodiments, matching the hardness of the substrate contact material to the hardness of the substrate material is based on a range of Mohs scale values discussed above with respect to top surfaces 122A and 122B and side surface 122C, and FIGS. 1A-1D.

At operation 430, in some embodiments, the substrate contact material having the hardness matched to the hardness of the substrate material is added to a substrate handling device. In some embodiments, adding the substrate contact material includes attaching a plurality of contact structures to the substrate handling device.

In some embodiments, the substrate handling device is a robot blade, and adding the substrate contact material includes attaching a substrate contact structure along an edge configured to contact a perimeter of a substrate or on a surface configured to contact a backside of the substrate. In some embodiments, the substrate handling device is a substrate carrier, and adding the substrate contact material includes attaching a substrate contact structure at a position configured to contact a perimeter or a backside of a substrate.

In some embodiments, the substrate handling device is substrate handling device 100, and adding the substrate contact material includes adding plurality of contact structures 120, discussed above with respect to FIGS. 1A-1D.

In some embodiments, the substrate handling device includes a lift pin, and adding the substrate contact material comprises attaching a contact structure to a top surface of the lift pin. In some embodiments, the substrate handling device is substrate handling device 200, and adding the substrate contact material includes adding plurality of contact structures 220, discussed above with respect to FIGS. 2A-2B.

At operation 440, in some embodiments, a substrate handling device is selected from a plurality of substrate handling devices based on the substrate contact material having the hardness matched to the hardness of the substrate material. In some embodiments, the substrate handling device is a robot blade, and selecting the substrate handling device includes selecting the robot blade from a plurality of robot blades based on the hardness of a substrate contact material included in a plurality of contact structures on each robot blade of the plurality of robot blades.

In some embodiments, the substrate handling device is a substrate carrier, and selecting the substrate handling device includes selecting the substrate carrier from a plurality of substrate carriers based on the hardness of a substrate contact material included in a plurality of contact structures on each substrate carrier of the plurality of substrate carriers.

In some embodiments, selecting the substrate handling device includes selecting substrate handling device 100 from a plurality of substrate handling devices 100, discussed above with respect to FIGS. 1A-1D.

In some embodiments, the substrate handling device includes a lift pin, and selecting the substrate handling device includes selecting the substrate handling device from a plurality of substrate handling devices based on the hardness of a substrate contact material included in contact structure on the lift pin. In some embodiments, selecting the substrate handling device includes selecting substrate handling device 200 from a plurality of substrate handling devices 200, discussed above with respect to FIGS. 2A-2B.

At operation 450, in some embodiments, a surface of the substrate contact material is modified to increase a coefficient of static friction of the surface of the substrate handling contact material. In some embodiments, modifying the surface of the substrate contact material includes using an etch process. In some embodiments, modifying the surface of the substrate contact material includes using a deposition process. In some embodiments, modifying the surface of the substrate contact material includes using a laser texturing process. In some embodiments, modifying the surface of the substrate contact material includes using an electron beam texturing process.

In some embodiments, modifying the surface of the substrate contact material includes forming a pattern on the surface of the substrate contact material. In some embodiments, modifying the surface of the substrate contact material includes forming a ridge pattern. In some embodiments, modifying the surface of the substrate contact material includes forming contact material surface pattern 300A, discussed above with respect to FIG. 3.

In some embodiments, modifying the surface of the substrate contact material includes forming a groove pattern. In some embodiments, modifying the surface of the substrate contact material includes forming contact material surface pattern 300B, discussed above with respect to FIG. 3.

In some embodiments, modifying the surface of the substrate contact material includes forming a pyramid pattern. In some embodiments, modifying the surface of the substrate contact material includes forming contact material surface pattern 300C, discussed above with respect to FIG. 3.

In some embodiments, modifying the surface of the substrate contact material includes modifying one or more of top surface 122A, top surface 122B, or side surface 122C, discussed above with respect to substrate handling device 100 and FIGS. 1A-1D.

In some embodiments, modifying the surface of the substrate contact material includes modifying top surfaces 222, discussed above with respect to substrate handling device 200 and FIGS. 2A-2B.

At operation 460, in some embodiments, a position of a substrate is controlled using a substrate handling device. The substrate handling device includes the substrate contact material, and controlling the position of the substrate using the substrate handling device includes contacting the substrate material with the substrate contact material.

In some embodiments, the substrate handling device is a robot blade, and controlling the position of the substrate using the substrate handling device includes contacting the substrate material with the substrate contact material included in a contact structure on the robot blade.

In some embodiments, the substrate handling device is a substrate carrier, and controlling the position of the substrate using the substrate handling device includes contacting the substrate material with the substrate contact material included in a contact structure on the substrate carrier.

In some embodiments, controlling the position of the substrate using the substrate handling device includes controlling the position of the substrate using substrate handling device 100, discussed above with respect to FIGS. 1A-1D.

In some embodiments, the substrate handling device includes a lift pin, and controlling the position of the substrate using the substrate handling device includes contacting the substrate material with the substrate contact material included in a contact structure on a top surface of the lift pin.

In some embodiments, controlling the position of the substrate using the substrate handling device includes controlling the position of the substrate using substrate handling device 200, discussed above with respect to FIGS. 2A-2B.

By executing the operations of method 400, a substrate is contacted using a contact material having a hardness aligned with the hardness of the substrate material being contacted. Because of this hardness alignment, scratching or other damage to either the substrate or the substrate handling device is reduced compared to approaches in which the hardness is not aligned with the hardness of the substrate material being contacted. Executing the operations of method 400 thereby provides the advantages discussed above with respect to substrate handling device 100.

In some embodiments, by performing operation 450 to increase the coefficient of static friction, method 400 provides the additional advantages discussed above with respect to substrate handling device 100.

An aspect of this description relates to a substrate handling device. The substrate handling device includes a substrate reception area defined by an edge. The substrate reception area includes a planar surface, wherein the edge extends upward from the planar surface. The substrate reception area further includes a plurality of contact structures extending upwards from the planar surface, wherein a first contact structure of the plurality of contact structures directly contacts a side surface of the edge, a second contact structure of the plurality of contact structures separated from the edge, a shape of the first contact structure is different from a shape of the second contact structure. The substrate reception area and the planar surface include a first material. Each contact structure of the plurality of contact structures includes a second material different from the first material, and the second material has a hardness aligned to a hardness of a substrate material. In some embodiments, the first contact structure includes a side surface angled with respect to the planar surface. In some embodiments, a top surface of the second contact structure is parallel to the planar surface. In some embodiments, a space between the first contact structure and the second contact structure is free of other contact structures of the plurality of contact structures. In some embodiments, the edge has an arc contour in a plan view. In some embodiments, the edge includes multiple non-continuous segments. In some embodiments, each of the multiple non-continuous segments has an arc contour. In some embodiments, each of the multiple non-continuous segments has a straight-line contour. In some embodiments, the substrate reception area is thinner than the edge. In some embodiments, a top-most surface of the first contact structure is coplanar with a top-most surface of the edge. In some embodiments, each of the plurality of contact structures includes silicon, silicon dioxide, silicon nitride, silicon carbide, a metal, a metal alloy, a method oxide, or a polymer. In some embodiments, the hardness of the first material is within two of a Mohs hardness scale of the second material. In some embodiments, the substrate handling device further includes a lift pin, wherein the second contact structure is attached to the lift pin. In some embodiments, the lift pin is retractable into the substrate reception area.

An aspect of this description relates to a processing chamber. The processing chamber includes a substrate reception area, wherein the substrate reception area includes a planar surface, and the substrate reception area includes a first material. The processing chamber further includes an edge surrounding at least a portion of the substrate reception area, wherein the edge protrudes perpendicular to the planar surface. The processing chamber further includes a first contact structure directly contacting a side surface of the edge. The processing chamber further includes a second contact structure separated from the edge, wherein a shape of the first contact structure is different from a shape of the second contact structure, each of the first contact structure and the second contact structure includes a second material different from the first material, and the second material has a hardness aligned to a hardness of a substrate material. In some embodiments, a top-most surface of the second contact structure is parallel to the planar surface. In some embodiments, a top-most surface of the first contact structure is angled with respect to the planar surface. In some embodiments, the top-most surface of the first contact structure is angled with respect to the side surface of the edge. In some embodiments, the processing chamber further includes a third contact structure between the first contact structure and the second contact structure.

An aspect of this description relates to a substrate handling device. The substrate handling device includes a substrate reception area, wherein the substrate reception area includes a planar surface, and the substrate reception area includes a first material. The substrate handling device further includes an edge surrounding at least a portion of the substrate reception area, wherein the edge protrudes perpendicular to the planar surface. The substrate handling device further includes a first contact structure directly contacting a side surface of the edge. The substrate handling device further includes a second contact structure separated from the edge, wherein a shape of the first contact structure is different from a shape of the second contact structure. The substrate handling device further includes a third contact structure between the first contact structure and the second contact structure, wherein each of the first contact structure, the second contact structure, and the third contact structure includes a second material different from the first material, and the second material has a hardness aligned to a hardness of a substrate material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A substrate handling device comprising:
   a substrate reception area defined by an edge, the substrate reception area comprising:
   a planar surface, wherein the edge extends upward from the planar surface; and
   a plurality of contact structures extending upwards from the planar surface, wherein a first contact structure of the plurality of contact structures directly contacts a side surface of the edge, a second contact structure of the plurality of contact structures separated from the edge, a shape of the first contact structure is different from a shape of the second contact structure,
   the substrate reception area and the planar surface comprise a first material, and
   each contact structure of the plurality of contact structures comprises a second material different from the first material, and the second material has a hardness aligned to a hardness of a substrate material.

2. The substrate handling device of claim 1, wherein the first contact structure comprises a side surface angled with respect to the planar surface.

3. The substrate handling device of claim 1, wherein a top surface of the second contact structure is parallel to the planar surface.

4. The substrate handling device of claim 1, wherein a space between the first contact structure and the second contact structure is free of other contact structures of the plurality of contact structures.

5. The substrate handling device of claim 1, wherein the edge has an arc contour in a plan view.

6. The substrate handling device of claim 1, wherein the edge comprises multiple non-continuous segments.

7. The substrate handling device of claim 6, wherein each of the multiple non-continuous segments has an arc contour.

8. The substrate handling device of claim 6, wherein each of the multiple non-continuous segments has a straight-line contour.

9. The substrate handling device of claim 1, wherein the substrate reception area is thinner than the edge.

10. The substrate handling device of claim 1, wherein a top-most surface of the first contact structure is coplanar with a top-most surface of the edge.

11. The substrate handling device of claim 1, wherein each of the plurality of contact structures comprises at least one of silicon, silicon dioxide, silicon nitride, silicon carbide, a metal, a metal alloy, a method oxide, or a polymer.

12. The substrate handling device of claim 1, wherein the hardness of the first material is within two of a Mohs hardness scale of the second material.

13. The substrate handling device of claim 1, further comprising a lift pin, wherein the second contact structure is attached to the lift pin.

14. The substrate handling device of claim 13, wherein the lift pin is retractable into the substrate reception area.

15. A processing chamber comprising:
    a substrate reception area, wherein the substrate reception area comprises a planar surface, and the substrate reception area comprises a first material;
    an edge surrounding at least a portion of the substrate reception area, wherein the edge protrudes perpendicular to the planar surface;
    a first contact structure directly contacting a side surface of the edge;
    a second contact structure separated from the edge, wherein a shape of the first contact structure is different from a shape of the second contact structure, each of the first contact structure and the second contact structure comprises a second material different from the first material, and the second material has a hardness aligned to a hardness of a substrate material.

16. The processing chamber of claim 15, wherein a top-most surface of the second contact structure is parallel to the planar surface.

17. The processing chamber of claim 15, wherein a top-most surface of the first contact structure is angled with respect to the planar surface.

18. The processing chamber of claim 17, wherein the top-most surface of the first contact structure is angled with respect to the side surface of the edge.

19. The processing chamber of claim 17, further comprising a third contact structure between the first contact structure and the second contact structure.

20. A substrate handling device comprising:
    a substrate reception area, wherein the substrate reception area comprises a planar surface, and the substrate reception area comprises a first material;
    an edge surrounding at least a portion of the substrate reception area, wherein the edge protrudes perpendicular to the planar surface;
    a first contact structure directly contacting a side surface of the edge;

a second contact structure separated from the edge, wherein a shape of the first contact structure is different from a shape of the second contact structure; and
a third contact structure between the first contact structure and the second contact structure, wherein each of the first contact structure, the second contact structure, and the third contact structure comprises a second material different from the first material, and the second material has a hardness aligned to a hardness of a substrate material.

* * * * *